United States Patent
Hashimoto et al.

(10) Patent No.: US 6,251,188 B1
(45) Date of Patent: Jun. 26, 2001

(54) APPARATUS FOR FORMING LAMINATED THIN FILMS OR LAYERS

(75) Inventors: Tsuyoshi Hashimoto, Kofu; Kimihiro Matsuse, Tama; Kazuya Okubo, Yamanashi-ken; Tsuyoshi Takahashi, Nirasaki, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/473,682

(22) Filed: Dec. 29, 1999

Related U.S. Application Data (62) Division of application No. 09/028,645, filed on Feb. 24, 1998, now Pat. No. 6,022,586.

(30) Foreign Application Priority Data

Mar. 4, 1997 (JP) .................................................. 9-065453

(51) Int. Cl.⁷ .................................................. C23C 16/00
(52) U.S. Cl. .................................................. 118/715
(58) Field of Search .................................................. 118/715

(56) References Cited

U.S. PATENT DOCUMENTS

| | | |
|---|---|---|
| 4,792,378 | 12/1988 | Rose et al. . |
| 4,923,715 | 5/1990 | Matsuda et al. ..................... 427/237 |
| 5,326,723 | 7/1994 | Petro et al. . |
| 5,554,255 * | 9/1996 | Karner et al. ..................... 156/643.1 |
| 5,653,806 * | 8/1997 | Van Buskirk ......................... 118/715 |
| 5,747,845 | 5/1998 | Iwasa .................................. 257/306 |
| 5,950,925 * | 9/1999 | Fukunaga et al. ................. 239/132.3 |
| 5,972,114 * | 10/1999 | Yonenaga et al. ..................... 118/715 |
| 5,990,016 * | 11/1999 | Kim et al. ............................. 156/345 |
| 6,063,198 * | 5/2000 | Bang et al. ........................... 118/715 |

FOREIGN PATENT DOCUMENTS

| | | |
|---|---|---|
| 0 478 908 | 4/1992 | (EP) . |
| 0 648 860 | 4/1995 | (EP) . |

OTHER PUBLICATIONS

Patent Abstract of Japan, vol. 097. No. 001, Jan. 31, 1997, and JP 08 246 154, Sep. 24, 1996.

* cited by examiner

*Primary Examiner*—Jeffrie R. Lund
*Assistant Examiner*—Sylvia R MacArthur
(74) *Attorney, Agent, or Firm*—Oblon, Spivak, McClelland, Maier & Neustadt, P.C.

(57) ABSTRACT

Pre-coating films are formed in a pretreatment by supplying first film-forming gases into a process chamber of a process vessel while heating the process chamber so as to form a first pre-coating film on the inner surface of the process vessel exposed to the process chamber, followed by supplying second film-forming gases into the process chamber to form a second pre-coating film on the first pre-coating film. A semiconductor wafer is loaded into the process chamber. Then, the first gases are supplied into the process chamber while heating the process chamber so as to form a first layer on the wafer, followed by supplying the second gases into the process chamber so as to form a second layer on the first layer. A silane gas is supplied into the process chamber to permit silicon material to be deposited on the surface of the second layer stacked on the first layer. Finally, the wafer having the first and second multi-film is unloaded out of the process vessel.

5 Claims, 7 Drawing Sheets

APPARATUS FOR FORMING LAMINATED THIN FILMS OR LAYERS

This application is a Division of application Ser. No. 09/028,645 Filed on Feb. 24, 1998 now U.S. Pat. No. 6,022,586.

BACKGROUND OF THE INVENTION

The present invention relates to a method and apparatus for forming laminated thin films or layers, i.e. a multi-layer structure, on a substrate such as a semiconductor wafer or a glass substrate so as to form, for example, a gate electrode of an MOSFET.

In the general method of manufacturing a semiconductor integrated circuit, a film-formation on a substrate such as a semiconductor wafer or a glass substrate and a patterned etching of the formed film are carried out repeatedly so as to obtain a desired semiconductor element.

Figure 9A:
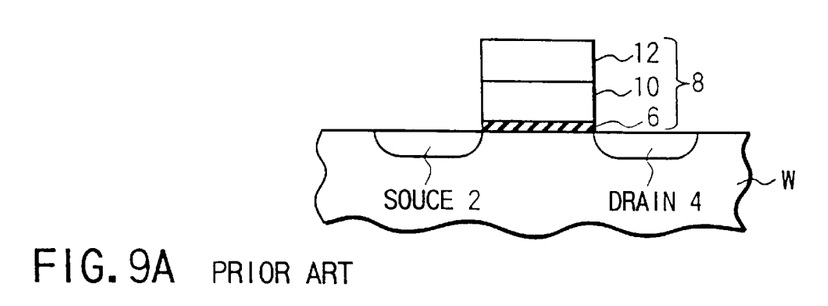
FIGS. 9A and 9B are collectively directed to formation of a gate electrode in the conventional MOSFET.
Figure 9B:
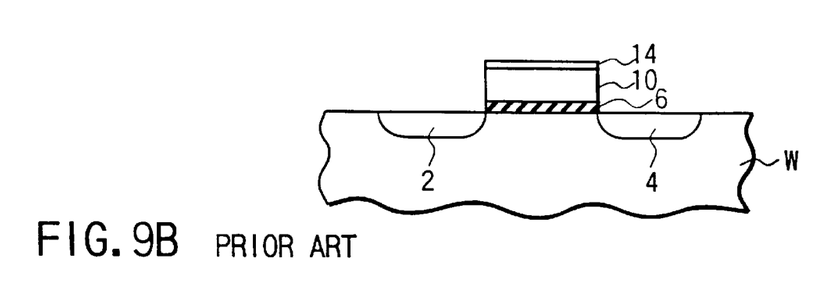

FIGS. 9A and 9B collectively show a conventional method of forming a laminated thin films collectively acting as a gate element of an MOSFET on a surface of a semiconductor wafer. As shown in FIG. 9A, an impurity of one conductivity type is diffused through the surface of the wafer W to form a source region 2 and a drain region 4, followed by forming a gate oxide film 6 consisting of, for example, $SiO_2$, on the wafer surface intermediate between these source and drain regions. As a result, a channel region is formed below the gate oxide film 6 such that the channel region is sandwiched between the source region 2 and the drain region 4. Further, an electrically conductive gate electrode 8 of a multi-layer structure is formed on the gate oxide film 6 so as to prepare an MOS transistor.

In general, the gate electrode 8 is not of a single layer structure. In recent years, the gate electrode 8 is of a two-layer structure in view of, for example, an electrical conductivity of the electrode. In the prior art exemplified in FIGS. 9A and 9B, a polycrystalline silicon (polysilicon) layer 10 doped with phosphorus is directly formed on the gate oxide film 6. Further, a metal silicide layer, e.g., tungsten silicide layer 12, is directly formed on the polysilicon layer 10, as shown in FIG. 9A. Thus, the gate electrode 8 is of a double layer structure consisting of the phosphorus-doped polysilicon layer 10 and the tungsten silicide layer 12.

Recently, a semiconductor integrated circuit is made finer and finer to increase the degree of integration. Naturally, requirements for decreasing a working line width and a gate width are made severer and severer. Also, a film thickness tends to be decreased to meet a requirement for an element of a multi-layer structure. Under the circumstances, each of the independent layers, as well as adjacent layers, collectively forming the multi-layer structure is required to exhibit electrical characteristics equivalent with or superior to those in the prior art in spite of the decreased thickness of each of these layers. The gate electrode 8 of the double-layer structure, which is shown in FIG. 9A, consisting of the phosphorus-doped polysilicon layer 10 and the tungsten silicide layer 12 is intended to meet the above-noted requirements.

It should be noted that a spontaneous oxide film 14 tends to be formed easily on a surface of a silicon-based film, e.g., the phosphorus-doped polysilicon layer 10, upon exposure to the air atmosphere containing water vapor, as shown in FIG. 9B. If the tungsten silicide layer 11 is formed directly on the oxide film 14, the bonding strength between the polysilicon layer 10 and the tungsten silicide layer 12 is impaired. In addition, a sufficient electrical conductivity between these layers 10 and 11 cannot be ensured, leading to deterioration in the electrical characteristics of the gate electrode 8.

In general, the polysilicon layer 10 is formed by a batch system simultaneously handling a large number of wafers in each lot, e.g., 150 wafers. On the other hand, the tungsten silicide layer 12 is formed by one-by-one process. It follows that the many polysilicon layers formed on the wafers by the batch system differ from each other in the exposure time to the air atmosphere and, thus, in the thickness of the spontaneous oxide film formed on the polysilicon layer 10. To overcome this difficulty, a wet etching using, for example, an HF-based vapor is applied to the surface of the polysilicon layer 10 so as to remove the native oxide film 14.

However, even if the native oxide film is removed by a wet etching immediately before formation of the tungsten silicide film 12, it is very difficult to prevent completely the base layer, i.e., polysilicon layer 10, from being adversely affected.

A measure for overcoming the above-noted difficulty is proposed in, for example, Japanese Patent Disclosure (Kokai) No. 2-292866. Specifically, it is proposed to form the phosphorus-doped polysilicon layer 10 within a process chamber, followed by consecutively forming the tungsten silicide layer 12 within the same process chamber.

Where the phosphorus-doped polysilicon layer 10 and the tungsten silicide layer 12 are consecutively formed within the same process chamber as proposed in the prior art noted above, it is certainly possible to prevent a native oxide film from being formed on the surface of the polysilicon layer 10, making it possible to form the electrode 8 exhibiting good electrical characteristics. In this case, however, a new problem is brought about. Specifically, where, for example, 25 wafers in a single lot are successively processed, careful attentions must be paid to a thermal instability on the wall surface of the process chamber or within the wafer-processing apparatus including the process chamber as well as to an instability in terms of the heat emission rate. If an impurity doped-polysilicon layer or the like is formed under this condition, the reproducibility of the formed layer is deteriorated.

Further, if the doped-polysilicon layer 10 and the tungsten silicide layer 12 are formed successively, stress remains in the upper tungsten silicide layer, leading to deterioration in the bonding strength between the tungsten silicide layer and the lower polysilicon layer. What should also be noted is that, an annealing treatment is applied in general at, for example, about 900° C. after formation of the tungsten silicide layer. In this annealing step, oxygen is diffused into the tungsten silicide layer 12 so as to deteriorate the electrical characteristics of the gate electrode 8.

Further, the reaction rate is limited in the reaction for forming a polysilicon layer; whereas, the reactant supply rate is limited in the reaction for forming the tungsten silicide layer. What should be noted is that the conventional shower head structure for introducing reactant gases for forming a film is incapable of coping with the above-noted difference in the rate-limiting type. It follows that the gas stream fails to flow uniformly over the entire substrate surface in the step of forming any of the phosphorus doped-polysilicon layer and the tungsten silicide layer, with the result that the uniformity is impaired in the thickness of the formed film.

BRIEF SUMMARY OF THE INVENTION

An object of the present invention is to provide a method of forming a film excellent in reproducibility of the film formation, which permits suppressing stress remaining within the formed film and also permits preventing oxygen from being diffused into the film under formation.

Another object is to provide an apparatus for forming a film, which permits coping with each of the reaction rate-limiting type reaction and the reactant supply rate-limiting type reaction.

In the present invention, a plurality of pre-coat layers are formed on the inner walls of each of the process chamber and the inner structure of the processing apparatus including the process chamber. The number of these pre-coat layers is equal to that of the films actually formed on a substrate. Also, these pre-coat layers are formed before formation of desired films on the substrate. It follows that the internal environment such as a heat emission rate from the inner wall of the process chamber or the inner structure of the processing apparatus is stabilized in the step of actually forming the desired films on the substrate. Since the desired films are consecutively formed on the substrate under the stabilized internal environment, the reproducibility of the film formation can be markedly improved in the present invention.

Further, an after-treatment is applied to the formed film in the present invention. As a result, silicon is slightly attached to the surface of the formed film. What should be noted is that the attached silicon functions to moderate the stress imparted to the formed film, leading to an improved bonding strength between adjacent films formed on the substrate. Still further, even if a heat treatment is applied to the substrate during the after-treatment, the attached silicon serves to prevent oxygen from attacking the silicon such as polysilicon, making it possible to prevent oxygen from being diffused into the formed film.

In the present invention, the film-forming step and the after-treating step are consecutively applied to a single substrate within a single processing apparatus, followed by unloading the processed substrate from the processing apparatus. Then, these film-forming step and after-treating step are consecutively applied to another single substrate within the same processing apparatus, followed by unloading the processed substrate from the processing apparatus. In this fashion, a plurality of substrates, e.g., 25 semiconductor wafers, in a single lot are consecutively processed.

After completion of the film formation process applied to a predetermined number of substrates, a cleaning gas is supplied into the process chamber for the cleaning purpose, followed by supplying a silane gas into the process chamber for performing a heat treatment. The heat treatment with a silane gas in the after-treatment for the cleaning purpose makes it possible to lower the amount of halogen elements remaining within the process chamber. This is effective for shortening the pre-coating time for the pretreatment step before formation of films on the substrate.

The particular film formation process of the present invention can be employed for depositing a tungsten silicide layer on a phosphorus-doped polysilicon layer so as to form a gate electrode of, for example, an MOSFET.

The apparatus of the present invention for forming a plurality of thin films includes a shower head section provided with a uniform dispersion plate having a large number of dispersion holes formed therethrough. What should be noted is that the diameter and arranging density of the dispersion holes are set appropriately in the present invention. As a result, the reactant gases for forming the desired films can be diffused uniformly over the entire region within the process chamber in each of the step of supplying reactant gases for the reaction rate-limiting type reaction and the step of supplying reactant gases for the reactant supply rate-limiting reaction. It follows that each of the films formed by the apparatus of the present invention is rendered highly uniform in thickness over the entire region of each film.

In the present invention, the uniform dispersion plate noted above constitutes the uppermost stage of a gas spurting region. Also, the diameter of each of the dispersion holes is set to be at most 0.7 mm. Further, these dispersion holes are arranged at a density of at least 0.3 hole/$cm^2$.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Let us describe an apparatus and a method for forming laminated films according to one embodiment of the present invention with reference to the accompanying drawings.

Figure 1:
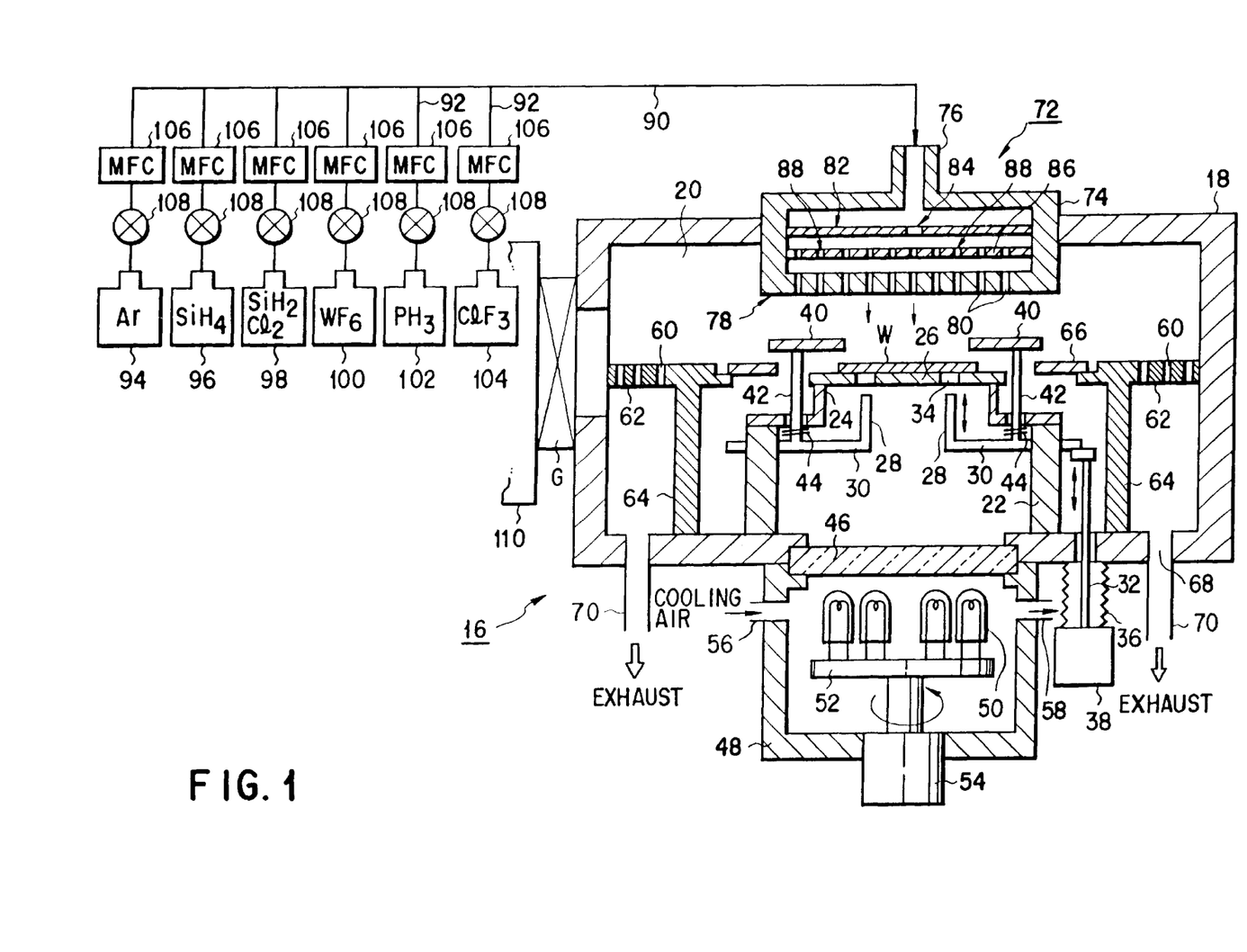
FIG. 1 is a cross sectional view schematically showing the construction of a film-forming apparatus used for working a film-forming method of the present invention.
Figure 2:
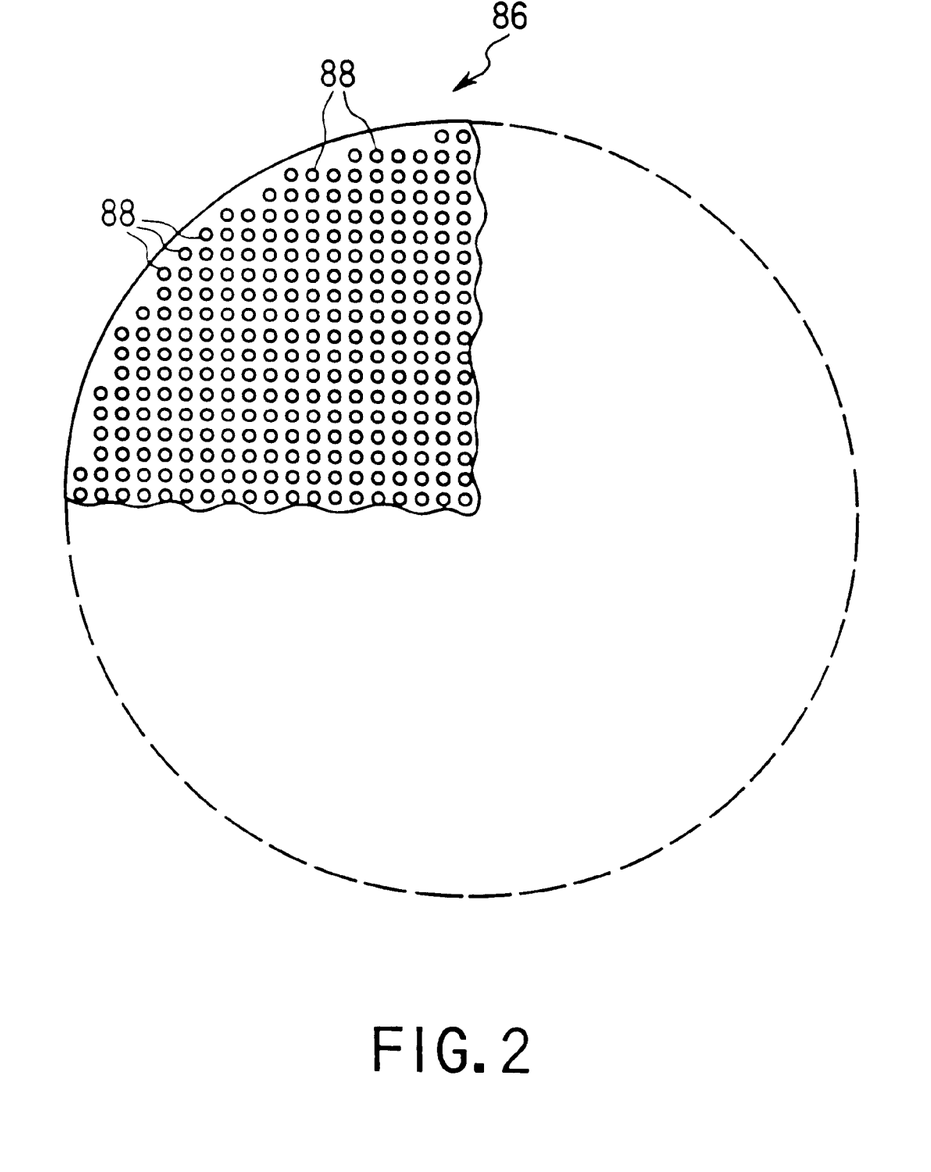
FIG. 2 is a partial plan view showing a uniform dispersion plate arranged within a shower head section of the film-forming apparatus shown in FIG. 1.

Specifically, FIG. 1 is a cross sectional view schematically showing the construction of a film-forming apparatus used for working a film-forming method of the present invention. On the other hand, FIG. 2 is a partial plan view showing a uniform dispersion plate arranged within a shower head section of the film-forming apparatus 16 shown in FIG. 1. The film-forming apparatus 16 is of one-by-one processing type and is provided with heating lamps which permit rapidly heating a semiconductor wafer.

The film-forming apparatus 16 comprises a process vessel 18 constructed by an upper wall, a circumferential side wall and a bottom wall. A process chamber 20 is defined within the process vessel 18. Also, the process vessel 18 should desirably be cylindrical and is formed of a metal such as aluminum. A support cylinder 22 open at the upper and lower ends is formed coaxial within the process vessel 18. The lower end of the support cylinder 22 is fixed to the bottom wall of the process vessel 18. On the other hand, a plurality of support members 24 are equidistantly supported in the circumferential direction by the upper end of the support cylinder 22. In a preferred embodiment, three support members 24 are arranged about 120° apart from each other. Each of these support members 24 is in the shape of L consisting of a horizontal arm portion and a vertical arm portion. The proximal end portion of the horizontal arm portion is mounted to the upper end of the support cylinder 22, with the distal end portion extending horizontal toward the center of the support cylinder 22. Further, the vertical arm portion extending upward is integrally fixed to the inner end of the horizontal arm portion. The upper ends of these vertical arm portions are connected to peripheral portions in a lower surface of a disk-like susceptor 26. As a result, the support member serves to support the susceptor 26 such that the table 26 is concentric with the support cylinder 22. A substrate such as a semiconductor wafer W is disposed on the susceptor 26. It should be noted that the diameter of the susceptor 26 is substantially equal to or larger than that of the wafer W. Each of the support cylinder 22 and the support member 24 is formed of a heat ray-transmitting material, e.g., quartz. Further, the susceptor 26 is made of a material having a thickness of about 1 mm to 5 mm, and exhibiting a high resistance to heat and a good thermal conductivity. For example, the table 26 is made of a carbon-based material or an aluminum compound such as aluminum nitride.

A plurality of L-shaped lifter pins 28 are arranged below the susceptor 26. For example, 3 lifter pins 28 are arranged below the table 26. These lifter pins 28 are joined to each other by a common ring (not shown) so as to be movable together in a vertical direction. Each of these lifter pins 28 consists of a vertical arm portion and a horizontal arm portion. The vertical arm portion is positioned below the susceptor 26 and extending in a vertical direction. On the other hand, the horizontal arm portion horizontally extends outwards through the support cylinder 22. As pointed out above, these lifter pins 28 are movable in a vertical direction. To be more specific, slots extending in a vertical direction are formed within the support cylinder 22. Of course, the horizontal arm portion of the lifter pin 28 extends through the slot formed within the support cylinder 22. The upper end of a driving rod 32 is joined to the outer end of the horizontal arm portion of one of these lifter pins 28. The driving rod 32 extends downward through a hole formed through the bottom wall of the process vessel 18 such that the lower end of the driving rod 32 is joined to an actuator 38 positioned below the process vessel 18. Of course, the driving rod 32 can be moved in a vertical direction by the actuator 38. If the driving rod 32 is moved upward, the three lifter pins 28 are also moved upward such that the upper portions of the vertical arm portions of these pins 28 project upward through lifter pin holes 34 extending through the susceptor 26. It follows that the wafer W disposed on the susceptor 26 is moved upward away from the table 26. To the contrary, if the driving rod 32 is moved downward, the wafer W supported on the upper ends of the lifter pins 28 is also moved downward so as to be disposed again on the susceptor 26.

A shrinkable bellows 36 is mounted to surround that portion of the driving rod 32 which is positioned between the lower surface of the bottom plate of the process vessel 18 and the upper surface of the actuator 38 so as to hermetically seal the process vessel 18.

A clamp ring 40 made of a ceramic material and acting as a fixing means of the wafer W is arranged above the circumferential outer region of the susceptor 26. To be more specific, the peripheral portion of the wafer W is pressed from above by the clamp ring 40 against the upper surface of the susceptor 26 so as to make the wafer W stationary. As apparent from the drawing, the clamp ring 40 is concentric with the susceptor 26 and is fixed to the upper ends of three ring arms 42 each extending loosely in a vertical direction through the horizontal arm portion of the support member 24. It is desirable for the ring arm 42 to be formed of a heat ray-transmitting material such as quartz. The lower end of the ring arm 42 is joined to the lifter pin 28. As a result, the clamp ring 40 is moved in a vertical direction via the ring arms 42 in accordance with a vertical movement of the lifter pins 28. Compression coil springs 44 are interposed between the lower surface of the horizontal arm portion of the support member 24 and the upper surface of the horizontal arm portion of the lifter pins 28, with the result that the clamp ring 40 is urged downward so as to permit the wafer W to be clamped without fail. It is desirable for lower portions of the ring arms 42 to be inserted into these coil springs 44, as shown in the drawing. It is also desirable for these lifter pins 28 and support member 24 to be formed of a heat ray-transmitting material such as quartz.

A circular opening concentric with the susceptor 26 is formed in a central portion of the bottom wall of the process vessel 18. The circular opening is positioned right under the susceptor 26 and is hermetically sealed with a transmitting window 46 made of a heat ray-transmitting material such as quartz. Further, a box-shaped heating housing 48 is mounted to the lower surface of the bottom wall of the process vessel 18 in a manner to surround the transmitting window 46. A heating means, e.g., a plurality of heating lamps 50 (i.e., halogen lamps), is mounted within the heating housing 48 such that the heating means is mounted to an upper surface of a rotatable plate 52 which also acts as a reflecting mirror. The rotatable plate 52 is joined to a rotary shaft of a motor 54 disposed at a bottom portion of the heating housing 48. As a result, the rotatable plate 52 is rotated by the motor 54 in a direction denoted by an arrow shown in FIG. 1. It is desirable for the rotatable plate 52 to be rotated coaxially with the susceptor 26. The heat rays emitted from these heating lamps 50 are transmitted through the transmitting window 46 so as to irradiate and heat the lower surface of the susceptor 26. As a result, the wafer W disposed on the susceptor can be rapidly heated by heat conduction to a predetermined temperature.

A cooling air inlet port 56 and a cooling air outlet port 58 are formed on the mutually facing side walls of the heating housing 48. A cooling air is introduced through the cooling air inlet port 56 into the heating housing 48 so as to cool the inner space of the heating housing 48 and the transmitting window 46. Then the air warmed within the heating chamber is discharged to the outside through the cooling air outlet port 58.

A ring-like flow regulating plate 62 having a large number of flow regulating holes 60 formed therethrough is arranged to surround the outer circumferential surface of the susceptor 26. The ring-like flow regulating plate 62 is arranged horizontal and concentric with the susceptor and is positioned near the circumferential inner surface of the process vessel 18. Also, the flow regulating plate 62 is held between the upper outer circumferential surface of a cylindrical support column 64 and the inner circumferential side wall surface of the process vessel 18. The lower end of the support column is fixed to the bottom wall of the process vessel 18. It should be noted that an upper inner circumferential surface of the support column 64 is stepped to form a stepped portion projecting inward. The stepped portion is formed over the entire circumferential region of the support column. An outer circumferential portion of a ring-like attachment member 66 made of quartz is mounted to the stepped portion of the support column. The attachment member 66, which is positioned concentric with the support column 64, serves to partition the inner space of the process vessel 18 into an upper chamber and a lower chamber so as to suppress the flow of the process gas into the lower chamber below the susceptor 26 as much as possible. It is possible to mount a water-cooling jacket (not shown) in the upper chamber positioned above the support column 64. A cooling water is circulated within the jacket so as to cool mainly the free space on the side of the flow regulating plate 62. A plurality of exhaust ports 68 are formed through those portions of the bottom wall of the process vessel 18 which are positioned below the flow regulating plate 62. These exhaust ports 68 are equidistantly arranged in the circumferential direction. An exhaust passageway 70 connected to a vacuum pump (not shown) is connected to each of the exhaust ports 68. As a result, the atmosphere within the process vessel 18 can be evacuated so as to maintain the inner pressure of the vessel 18 at a vacuum of, for example, 100 Torr to $10^{-6}$ Torr.

A pressure release valve (not shown) operable at a differential pressure of about, for example, 0.1 kg/cm$^2$ can be mounted in the support column 64. The pressure release valve is opened when the inner pressure of a gas chamber below the susceptor 26 is excessively increased so as to release partly the gas through the exhaust port via a free space formed between the support column and the inner circumferential surface of the process vessel. It follows that the inner pressure of the gas chamber is prevented from being excessively increased by an inert gas flowing backward into the process vessel.

A shower head section 72 is provided in that region of a ceiling portion of the process vessel 18 which faces the susceptor 26. Gases such as a film-forming gas (process gas) and a cleaning gas are introduced into the process chamber 20 through the shower head section 72. To be more specific, the shower head section 72 comprises a head body 74 made of, for example, aluminum and shaped like a cylindrical box, and a gasinlet 76 provided in a central portion of the ceiling of the head body 74.

A gas ejection wall 78 constitutes the bottom wall of the head body 74. A large number of gas ejection holes 80 for releasing the gas supplied into the head body 74 are uniformly arranged over the entire region of the gas ejection wall 78, with the result that the gas is uniformly released over the entire surface of the wafer W supported on the table 26. The gas ejection wall 78 has a diameter of, for example, 316 mm. On the other hand, the gas ejection hole 80 has a diameter of about 1 mm. These gas ejection holes 80 are formed at a density of about 10 holes/cm$^2$ in a central portion, having a diameter of 230 mm, of the gas ejection wall. These values in respect of the diameters of the gas ejection wall and the gas ejection hole and the density of the gas ejection holes 80 are substantially equal to those in the conventional shower head section.

Two uniform dispersion plates, i.e., upper and lower dispersion plates 82 and 86, respectively, are superposed one upon the other a predetermined distance apart from each other within the head body 74 so as to form a plurality of diffusion chambers within the head body 74. The presence of these dispersion plates permits the apparatus of the present invention to produce a prominent effect. The upper dispersion plate 82 is provided with a very small number of gas spurting holes, e.g., only one gas passing hole 84 or several gas passing holes. In the embodiment shown in FIG. 1, the upper dispersion plate 82 is provided with only one gas passing hole 84 having a diameter of about 1.5 mm. In forming a plurality of gas passing holes through the upper dispersion late 82, it is possible for all holes to have the same diameter. It is also possible for some of these holes to have the same diameter. For example, it is possible to form a relatively large single gas passing hole 84 in the center and relatively small six gas passing holes 84 arranged to surround the central gas passing hole.

A large number of very small dispersion holes 88 are formed uniformly through the lower uniform dispersion plate 86. The diameter of the dispersion hole 88 and the distribution density of these dispersion holes are determined to permit a gas stream to be supplied uniformly over the entire region of the process chamber 20 in each of the cases where film-forming gases are supplied from the shower head section 72 for carrying out the reaction rate-limiting reaction and where film-forming gases are supplied for carrying out the gas supply rate-limiting reaction. To be more specific, where the dispersion hole 88 has an unduly large diameter, it is certainly possible to carry out the reaction rate-limiting reaction by suitably changing the distribution density of the dispersion holes 88. However, it is impossible to control as desired the reactant gas supply rate-limiting reaction. To the contrary, where the diameter of the dispersion hole 88 is excessively small, it is certainly possible to carry out the reactant gas supply rate-limiting reaction by increasing the distribution density of the dispersion holes 88. However, it is impossible to control as desired the reaction rate-limiting reaction. In other words, in order to enable the apparatus to carry out satisfactorily each of the reactant gas supply rate-limiting reaction and the reaction rate-limiting reaction, it is necessary to choose appropriately the diameter of the dispersion hole 88 and the distribution density of these dispersion holes 88.

In the embodiment shown in the drawing, the diameter (or inner diameter) of the dispersion hole 88 should be about at most 0.7 mm. On the other hand, the dispersion holes 88 should be formed at a distribution density of at least 0.3 hole/cm$^2$. The lower limit in the diameter of the dispersion hole 88 is not particularly limited in the present invention, as far as it is possible for the gas to flow smoothly through the hole 88. However, the lower limit in the diameter of the dispersion hole is determined by the performance of the punching tool used. Where, for example, the lower uniform dispersion plate 86 has a thickness of about 10 mm, the lower limit in the diameter of the dispersion hole 88 should be about 0.2 mm.

On the other hand, the upper limit in the distribution density of the dispersion holes 88 is not particularly limited in the present invention, as far as adjacent holes are not joined to each other. Preferably, the diameter of the dispersion hole should fall within a range of between about 0.1 mm and 0.7 mm. Also, the distribution density of the dispersion holes should fall within a range of between 0.3 hole/cm² and 1.0 hole/cm². Where, for example, the uniform dispersion plate 86 has a diameter of about 30 cm, it is desirable to form uniformly about 190 dispersion holes each having a diameter of 0.65 mm. FIG. 2 is a plan view partly showing the uniform dispersion plate 86 of this construction. The uniform dispersion plate of this construction permits uniformly supplying gases over the entire region of the reaction chamber in each of the cases where film-forming gases are supplied for carrying out the reaction rate-limiting reaction and the case where the film-forming gases are supplied for carrying out the reactant gas supply rate-limiting reaction.

A single gas passageway 90 is connected at one end to the gas inlet port 76 of the shower head section 72 and at the other end portions to various film-forming gas sources and cleaning gas sources via various branched passageways 92. As shown in FIG. 1, the gas passageway 90 is connected to an Ar gas source 94 for storing an Ar gas used as a carrier gas, to an $SiH_4$ source 96 for storing an $SiH_4$ gas used as a film-forming gas, to an $SiH_2Cl_2$ source 98 for storing an $SiH_2$ gas used as a film-forming gas, to a $WF_6$ source 100, to a $PH_3$ source 102 for storing a $PH_3$ gas used as a doping gas, and to a $ClF_3$ source 104 for storing a $ClF_3$ gas used as a cleaning gas. A flow rate control valve 106 such as a mass flow controller and an ordinary valve 108 are connected in series to each of the branched passageways 92. In the embodiment shown in the drawing, the ordinary valve 108 is interposed between the gas source and the flow rate control valve 106, though it is possible to reverse the positions of these valves 106 and 108.

Further, an opening for transferring the wafer W into or out of the process chamber 20 is formed through one side wall of the process vessel 18. The particular opening communicates with a load lock chamber 110 via a gate valve G. The inner space of the load lock chamber 110 is held vacuum, and the wafer which is to be processed is temporarily stored in the load lock chamber.

Figure 3:
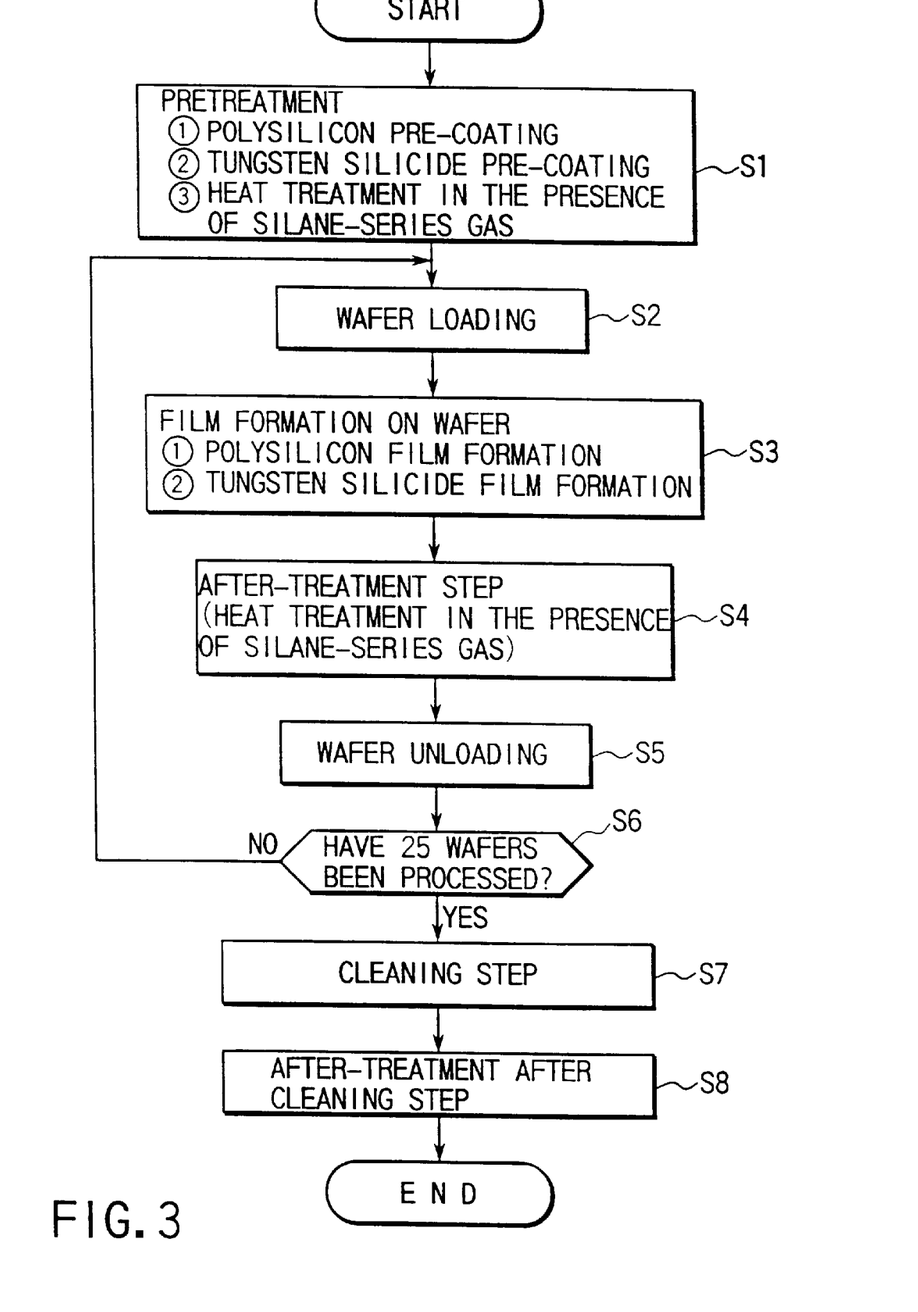
FIG. 3 is a flow chart showing the process steps included in a method according to one embodiment of the present invention.

The apparatus of the construction described above is used for working a method of the present invention for forming laminated thin films or a multi-layer construction. Specifically, FIG. 3 is a flow chart showing the process steps employed in the method of the present invention. As described previously, the present invention is featured in that, for forming a plurality of different kinds of films within a single process chamber, the process gases and the carrier gas are introduced into the process chamber as a pretreatment which is carried out without disposing the wafer W on the table 26 so as to pre-coating in advance the inner surfaces of, for example, the process chamber with films of the compositions equal to those of the films formed on the wafer W. The present invention is also featured in that, after formation of the films, a surface treatment is carried out with a silane-series gas in the presence of the wafer W. This embodiment covers the case where the polysilicon layer 10 doped with phosphorus and the tungsten silicide layer 12 are formed in succession as shown in FIG. 9A.

In the first step, a pretreatment is performed before the wafer W is loaded in the process chamber 20 (step S1). In this pretreatment, the gases, which are to be introduced into the process chamber in the subsequent step of forming desired films on the wafer and in the after-treatment step, are introduced into the process chamber so as to form pre-coating laminated films on the inner surfaces of the wall and the internal structure of the process vessel 18. As described previously, these pre-coating films are intended to make the conditions within the process vessel such as the thermal reflectance and emissivity equal to those in the step of forming the desired laminated films on the wafer W so as to improve the reproducibility of the film formation on the wafer.

In this pretreatment step, the process chamber is evacuated first to a predetermined vacuum level. At the same time, the inner temperature of the process vessel is elevated to 500° C. to 800° C. Under these conditions, predetermined amounts of gases equal to those used for forming a polysilicon film doped with phosphorus on the wafer W are introduced into the process vessel so as to form a pre-coating polysilicon film doped with phosphorus on the inner surface of the process chamber 20 and on the surfaces of the internal structure within the process vessel 18 such as the clamp ring 40 and the flow regulating plate 62. In this embodiment, predetermined amounts of Ar gas (carrier gas), $SiH_4$ gas (reactant gas), and $PH_3$ gas (dopant gas) are introduced into the process chamber 18 for forming the pre-coating polysilicon film noted above. Incidentally, the $PH_3$ gas used as a dopant gas scarcely affects, for example, the thermal reflectance, making it possible to omit the $PH_3$ gas supply in the pretreatment step.

After formation of the pre-coating polysilicon film, the gases remaining within the process vessel 18 are discharged by vacuum suction from the process vessel. Then, predetermined amounts of gases equal to those used for forming a tungsten silicide ($WSi_x$) film on the wafer W are introduced into the process vessel so as to form a tungsten silicide film on the pre-coating polysilicon film doped with phosphorus. In this embodiment, predetermined amounts of Ar gas, $WF_6$ gas, and $SiH_2Cl_2$ gas are introduced into the process chamber 18 for forming the tungsten silicide film noted above on the pre-coating polysilicon film formed in advance. It is desirable for the pre-coating amounts for each of the doped polysilicon film and the tungsten silicide film to be somewhat larger than those for actually forming the doped polysilicon film and the tungsten silicide film on the wafer W so as to improve the reproducibility of forming these films on other wafers W.

In this embodiment, a silane-series gas is introduced into the process vessel 18 in the after-treatment step for allowing silicon to be deposited on the surface of the tungsten silicide film formed on the wafer. In this connection, a predetermined amount of an $SiH_4$ gas used as a silane-series gas is introduced in the pretreatment step into the process chamber together with an Ar gas used as a carrier gas so as to permit silicon to be deposited in a small amount on the surface of the pre-coated tungsten silicide film. Incidentally, it is also possible to use an $SiH_2Cl_2$ gas as a silane-series gas.

After the pretreatment carried out in the absence of the wafer W, the wafer is loaded in the process chamber 20 (step S2). To be more specific, an untreated semiconductor wafer W housed in the load lock chamber 110 is transferred through the gate valve G into the process chamber 20. At the same time, the lifter pins 28 are pushed up so as to permit the wafer W to be delivered toward the lifter pins 28. Then, the wafer W is disposed on the susceptor 26, followed by moving further downward the push up rod 32. As a result, the clamp ring 40 is allowed to be pressed against a peripheral portion of the wafer W. It follows that the wafer W is fixed to the susceptor 26. Incidentally, the term "untreated semiconductor wafer W" noted above represents a wafer having the gate oxide film 6, which is shown in FIG. 9A, formed in advance in another process furnace.

When the wafer loading in the process chamber is finished in this fashion, the step of actually forming a polysilicon film on the gate oxide film 6 is carried out (step S3). In the first step, formed is a polysilicon film doped with phosphorus. In this step, the heating lamps 50 arranged within the heating housing 48 are rotated so as to achieve a heat energy emission uniformly, while evacuating the process chamber 20 by means of vacuum suction. The heat rays thus emitted are transmitted through the transmitting window 46 and, then, through other members of the apparatus such as the support member 30 made of quartz so as to irradiate the back surface of the susceptor 26. As described previously, the susceptor 26 is very thin, i.e., about 1 to 5 mm, with the result that the table 26 is rapidly heated. Naturally, the wafer W disposed on the susceptor 26 is also heated rapidly to a predetermined temperature.

If the wafer W is heated to a process temperature of, for example, 700° C., the $SiH_4$ (silane) gas and the $PH_3$ (phosphine) gas are introduced together with the carrier gas of Ar gas into the process chamber 20 through the shower head section 72. These silane and phosphine gases are supplied at rates of about 150 sccm and about 400 sccm, respectively.

A predetermined chemical reaction takes place within the process chamber 20 between the silane and phosphine gases so as to form a polysilicon layer 10 doped with phosphorus (P) acting as an impurity of one conductivity type on the gate oxide film 6 formed on the wafer W, as shown in FIG. 9A. Incidentally, it is also possible to use dopants other than phosphorus such as As (arsenic), Sb (antimony) and B (boron). In order to obtain the doped polysilicon layer 10 having a predetermined thickness, the film-forming operation described above is performed for about, for example, one minute. Also, the process pressure in this step is about 10 Torr.

After formation of the doped polysilicon layer 10, a tungsten silicide film is formed on the polysilicon layer 10 as follows. In the first step, the supply of the $PH_3$ gas and $SiH_4$ gas is stopped. Under this condition, an Ar gas is allowed to flow through the process chamber 20 so as to purge the phosphine gas from within the process chamber 20. At the same time, the power supplied to the heating lamps 50 is controlled so as to slightly lower the temperature of the wafer W to the process temperature of the tungsten silicide, e.g., about 600° C. The purging with the argon gas is performed for several minutes. In this case, it is possible to set the process temperature of tungsten silicide at a value equal to that of polysilicon.

When the process temperature is reached, the reactant gases of $SiH_2Cl_2$ gas and $WF_6$ gas are supplied into the process chamber 20 together with a carrier gas of Ar gas so as to form a tungsten silicide film on the polysilicon film. The flow rates of these $SiH_2Cl_2$ gas and $WF_6$ gas should be about 200 sccm and about 10 sccm, respectively. It is possible to use $SiH_4$ gas, etc. in place of the $SiH_2Cl_2$ gas. Also, an $N_2$ gas or He gas can be used in place of the argon gas used as a carrier gas.

A predetermined chemical reaction takes place within the process chamber 20 between the reactant gases so as to form the tungsten silicide layer 12 shown in FIG. 9A. In order to obtain the tungsten silicide layer having a predetermined thickness, the film-forming reaction is carried out for about, for example, 2 minutes. The process pressure in this step should be about 1 Torr.

It should be noted that the film-forming reaction for forming the polysilicon layer or film 10 doped with phosphorus is a reaction rate-limiting reaction. On the other hand, the film-forming reaction for forming the tungsten silicide layer or film 12 is a reactant supply rate-limiting reaction. In the apparatus of the present invention, however, the diameter of the dispersion hole 88 formed through the uniform dispersion plate 86, which is arranged within the shower head section 72, and the distribution density of the dispersion holes 88 are set appropriately, making it possible to supply the reactant gases and the carrier gas into the process chamber uniformly over the entire region of the process chamber 20 for each of the reaction rate-limiting reaction and the reactant supply rate-limiting reaction. It follows that each of these polysilicon layer 10 and tungsten silicide layer 12 can be formed in a uniform thickness over the entire region.

After formation of the tungsten silicide layer 12, an after-treatment is carried out with the wafer W left disposed on the susceptor 26 (step S4). In the first step, the inner atmosphere of the process vessel 18 is evacuated by vacuum suction. Under this condition, a silane-series gas, e.g., $SiH_4$ gas, is supplied into the process chamber 20 for a short time, e.g., about 60 seconds, while substantially maintaining the temperature in the step of forming the tungsten silicide layer 12, e.g., 600 to 700° C., so as to deposit silicon slightly on the surface of the tungsten silicide layer. The silicon deposition amount is controlled to form a thin silicon film on the tungsten silicide layer 12 or to allow silicon flakes to be attached only slightly to the tungsten silicide layer not to form a continuous silicon film. The deposited silicon permits moderating the stress within the tungsten silicide layer so as to improve the bonding strength between the polysilicon layer 10 and the tungsten silicide layer 12, as described herein later. Also, the deposited silicon makes it possible to prevent the tungsten silicide layer 12 from being attacked by oxygen in the subsequent heat treatment step.

After completion of the after-treatment described above, the heating lamps 50 are turned off so as to lower the wafer temperature to, for example, about 300° C. adapted for the wafer transfer while purging the gases remaining inside the process vessel 18 with an argon gas. Then, the gate valve G is opened so as to unload the treated wafer W out of the process vessel 18 (step S5), followed by loading an untreated wafer into the process chamber as described previously ("NO" in step S6). In this case, the film-forming step S3 and the after-treatment step S4 are continuously applied to the new untreated wafer as described previously. The continuous processing is applied to one lot consisting of, for example, 25 wafers.

After the unloading of a predetermined number of wafers, e.g., 25 wafers ("YES" in step S6), the process vessel is treated with a cleaning gas in order to remove the films remaining in small amounts on the surfaces of the inner wall of the process chamber and the internal structure within the process vessel 18 (step S7). To be more specific, a $ClF_3$ gas used as a cleaning gas is introduced into the process vessel. Under this condition, the process chamber is heated to, for example, about 200° C. so as to carry out the cleaning treatment for several minutes. As a result, the undesired films attached to the inner wall of the process chamber can be removed, making it possible to suppress problems such as the particle generation which is caused by the peeling of the attached films noted above. The cleaning treatment is performed in view of the amount of the films attached to the inner wall of the process chamber, etc. For example, the cleaning treatment is performed every time the series of treatments described above are applied to a single wafer. In short, it suffices to determine the number of times of applying the series of treatments in view of the through-put and the amount of the particle generation. It should be noted that a fluorine-containing gas permits effectively removing each of polysilicon and tungsten silicide. Therefore, it is desirable to use, for example, a ClF$_3$-series gas as a cleaning gas, though the cleaning gas used in the present invention need not be limited to ClF$_3$ gas.

After completion of the cleaning step, an after-treatment after the cleaning treatment is performed (step S8). In this step, a silane-series gas is supplied into the process chamber so as to promote discharge of the halogen gas used in the cleaning step and, thus, to improve the adhesion of pre-coating films which are to be formed in the subsequent pretreatment step.

To be more specific, after discharge of the cleaning gas, the temperature within the process chamber is elevated to, for example, about 600° C. Under this condition, a heat treatment is carried out for about one minute while allowing an SiH$_4$ gas to flow into the process chamber at a predetermined flow rate. As a result, the halogen gas attached to the inner wall of the process chamber and to the surface of the internal structure is reduced with the silane gas. It follows that the discharge of the halogen gas is promoted. It is possible to use an SiH$_2$Cl$_2$ gas in place of the silane (SiH$_4$) gas.

In the method of the present invention, one process cycle consists of steps S1 to S8 described above.

As described above, the method of the present invention is featured in that the tungsten silicide layer 12 is formed immediately after formation of the polysilicon layer 10 doped with phosphorus within the same process chamber. In other words, the wafer W need not be taken out of the process chamber after formation of the polysilicon film. Naturally, it is substantially impossible for a native oxide film to be formed on the surface of the polysilicon layer 10. It follows that the resistance of the gate electrode can be lowered. Also, the electrical characteristics can be improved markedly.

It should also be noted that, in the present invention, pre-coating laminated films are formed on the inner wall of the process chamber and on the surface of the internal structure before formation of the polysilicon layer 10 and tungsten silicide layer 12 on the wafer W. It is important to note that these pre-coating films are formed of the materials equal to those of the layers 10 and 12 formed on the wafer W. Also, a film of the gas used in the after-treatment is included in the pre-coating films. It follows that the process chamber is thermally stabilized so as to maintain a high reproducibility of the layers 10 and 12 formed on the wafer W.

Further, an after-treatment is applied to the wafer after formation of the layers 10 and 12 so as to allow silicon continuous or discontinuous thin films to be deposited on the surface of the tungsten silicide layer 12. As a result, the stress within the tungsten silicide layer 12 is moderated. Also, the layer 12 can be prevented from being attacked by oxygen in the subsequent heat treating step.

Figure 4:
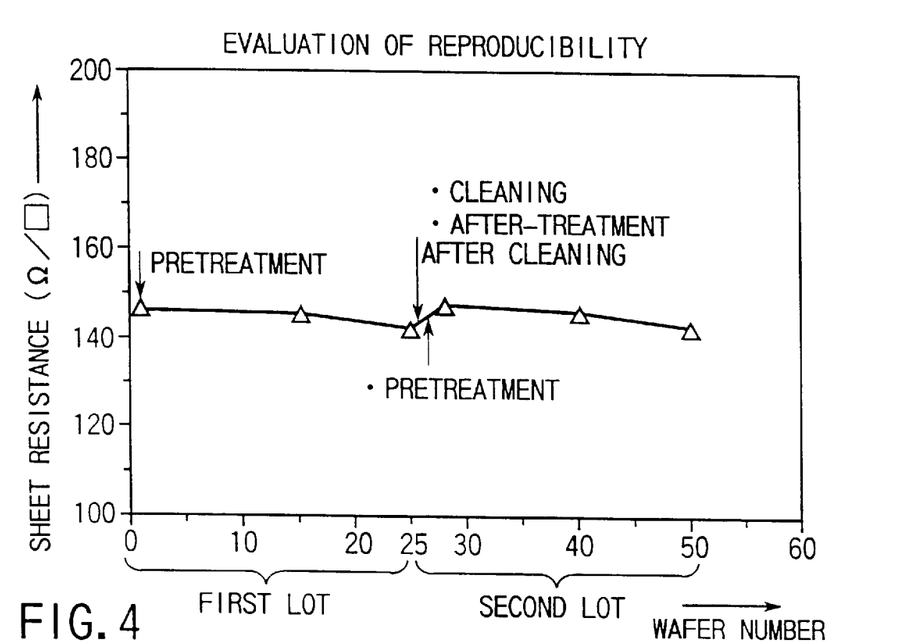
FIG. 4 is a graph showing the changes in the sheet resistance of each wafer, covering the case where a film is formed on the surface of each of the semiconductor wafers within first and second lots, each lot consisting of 25 wafers.

The pre-coating films formed in the pretreatment step produce prominent effects. Specifically, FIG. 4 is a graph showing the changes in the sheet resistance of the gate electrode included in each wafer, covering the case where a film is formed on the surface of each of the semiconductor wafers within first and second lots, each lot consisting of 25 wafers. In this experiment, pre-coating films were formed in the pretreatment immediately before each of the first lot and the second lot. As shown in FIG. 4, a difference between the maximum and minimum values of the sheet resistance was found to be about 5Ω/□. In other words, a deviation in the sheet resistance among the wafers was found to be about 3%, supporting a markedly high reproducibility.

Figure 5:
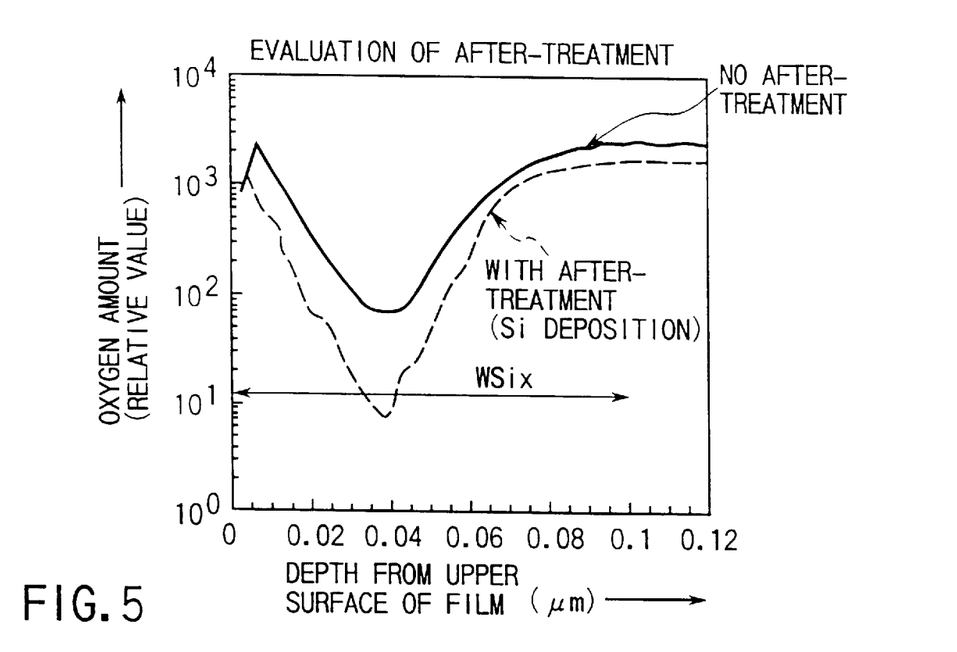
FIG. 5 is a graph showing the degree of oxygen diffusion into the formed film, covering the cases where silicon is attached, and is not attached, to the upper surface of the base layer.

As described previously, an after-treatment step is carried out immediately after the step of forming the polysilicon layer 10 and the tungsten silicide layer 12 so as to deposit continuous or discontinuous silicon thin films on the surface of the layer 12. The silicon deposition produces a prominent effect as shown in FIG. 5. To reiterate, FIG. 5 is a graph showing the degree of oxygen diffusion into the formed film, covering the cases where silicon is attached, and not attached, to the upper surface of the tungsten silicide layer 12. In the graph of FIG. 5, the depth from the upper surface of the gate electrode toward the wafer is plotted on the abscissa, with the oxygen amount being plotted on the ordinate indirectly. In this experiment, the oxygen attack was performed by heating the wafer to about 90° C.

As apparent from the graph of FIG. 5, the silicon deposition by the after-treatment on the surface of the tungsten silicide layer 12, which is denoted by a broken line, permits decreasing the oxygen amount in the tungsten silicide (WSi$_x$) layer, compared with the non-deposition, which is denoted by a solid line. In other words, the oxygen diffusion is suppressed by the silicon deposition.

Figure 6:
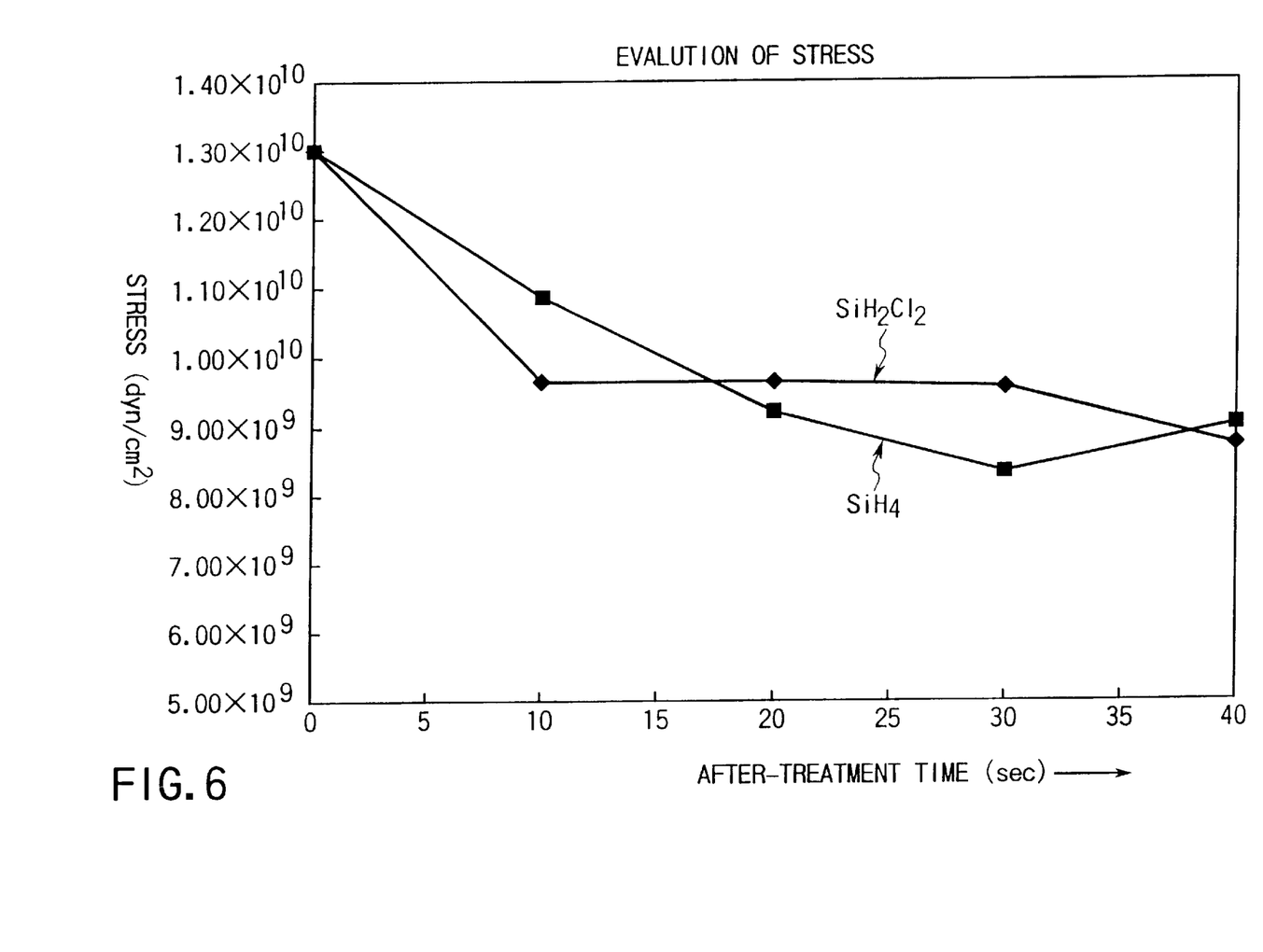
FIG. 6 is a graph showing the effect produced by an after-treatment step in respect of moderation of stress remaining within the film formed in advance.

FIG. 6 is a graph showing another effect produced by the after-treatment step in respect of moderation of stress remaining within the tungsten silicide layer. In the graph of FIG. 6, the supply time of the silane gas into the process chamber and the supply time of the dichlorosilane (SiH$_2$Cl$_2$) gas into the process chamber are plotted on the abscissa, with the stress being plotted on the ordinate. In this after-treatment step, the silane gas flow rate was set at SiH$_4$/Ar= 500/400 sccm, the dichlorosilane gas flow rate was set at SiH$_2$Cl$_2$/Ar=150/350 sccm, and the process pressure was set at 0.7 Torr.

As apparent from the graph of FIG. 6, the stress within the film was as high as $1.30 \times 10^{10}$ dyn/cm$^2$ in the case where the after-treatment was not performed (after-treating time of zero second). However, the stress is lowered sufficiently by the after-treatment in each of the after-treatments with the silane gas and with the dichlorosilane gas. It follows that the bonding strength between the polysilicon layer 10 and the tungsten silicide layer 12 can be increased by the after-treatment. It should also be noted that a satisfactory effect can be produced in the case of using either a silane gas or a dichlorosilane gas in the after-treatment.

Figure 7:
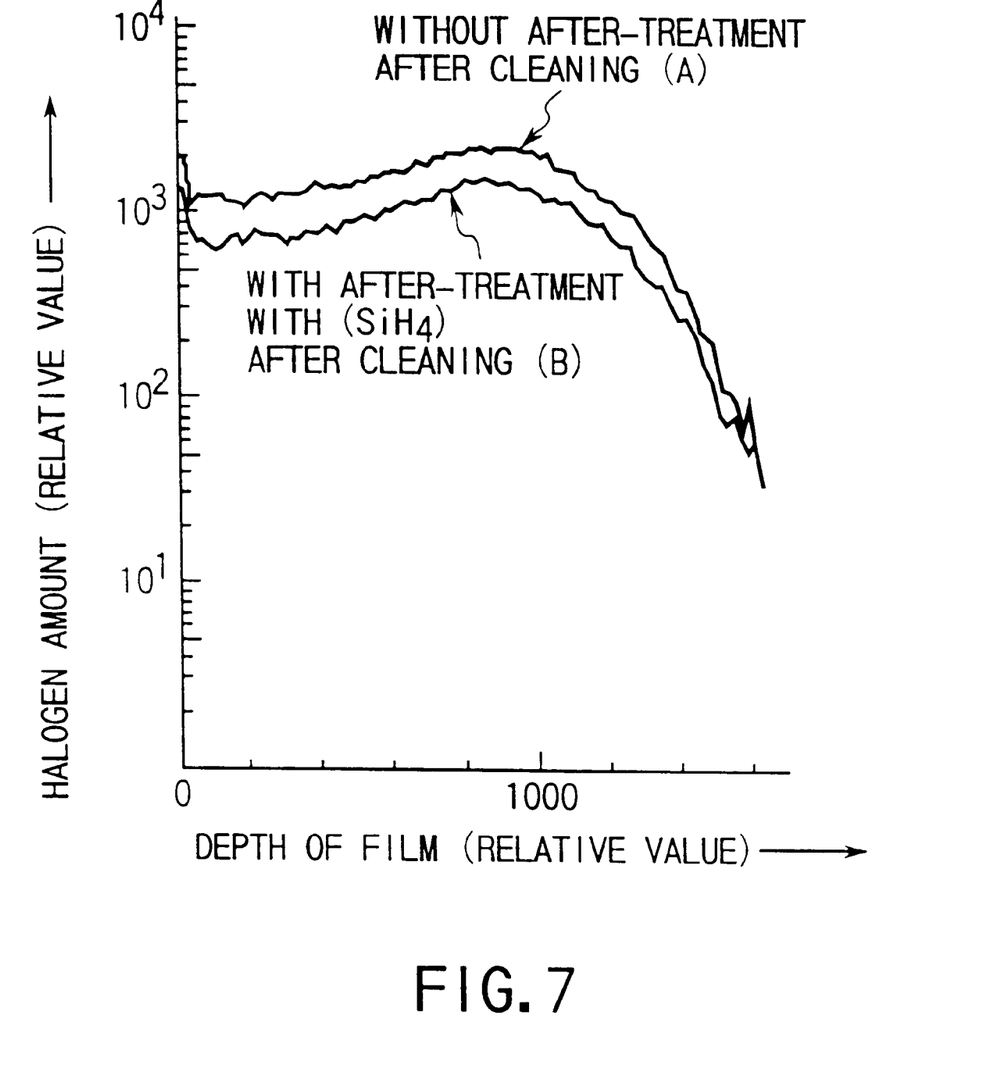
FIG. 7 is a graph showing the remaining amount of the halogen elements, covering the cases where a cleaning after-treatment is performed, and is not performed.

As described previously, another after-treatment, i.e., treatment with a silane-series gas, is performed after the cleaning step so as to remove halogen elements attached to the inner wall of the process chamber to the surface of the internal structure of the process vessel 18. FIG. 7 is a graph showing the effect produced by this second after-treatment with a silane-series gas in respect of the remaining amount of a halogen element (chlorine) on the surface of the tungsten silicide (WSi$_x$) film. In this experiment, silane (SiH$_4$) was used as the silane-series gas. Curve B in FIG. 7 shows the case of performing said another after-treatment after the cleaning step, with curve A denoting the case of not performing the particular after-treatment with a silane-series gas. As apparent from FIG. 7, the after-treatment with a silane gas is effective for suppressing the remaining halogen amount so as to suppress adverse effects given by the halogen element on the tungsten silicide layer.

Figure 8:
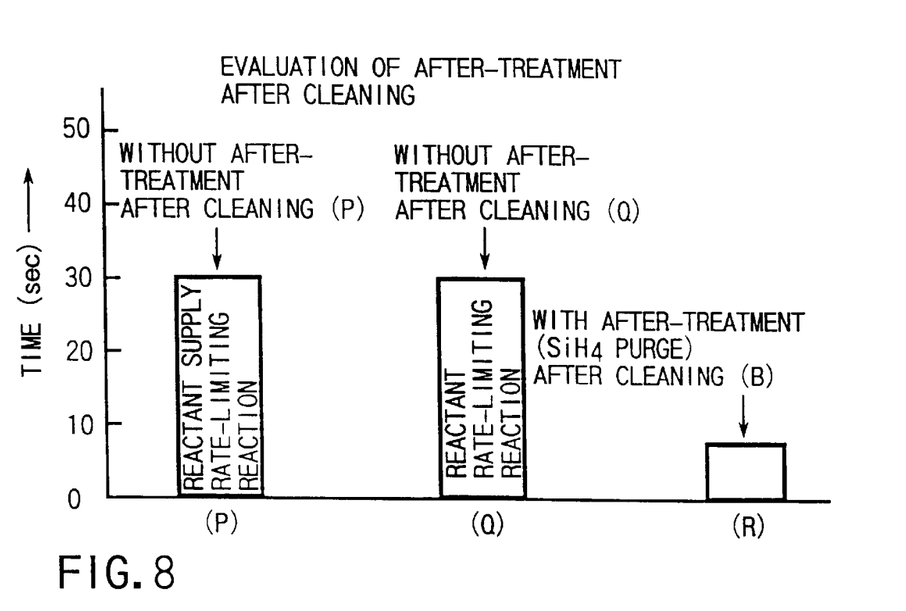
FIG. 8 is a graph showing the effect produced by a cleaning after-treatment in respect of the pre-coating on, for example, the inner wall of the process chamber in preparation for the subsequent film formation on a substrate.

The particular after-treatment with a silane-series gas produces an additional effect. Specifically, it is possible to facilitate formation of pre-coating films in the pretreatment on the inner wall of the process chamber 20 and on the surface of the internal structure in the process vessel 18, as shown in FIG. 8. In the graph of FIG. 8, the time for the pre-coating films to reach a predetermined thickness is plotted on the ordinate. Bars P and Q in the graph of FIG. 8 cover the cases of not applying the after-treatment with the silane gas, and are directed to the reactant gas supply-rate limiting reaction and the reaction rate-limiting reaction, respectively. On the other hand, bar R covers the case of applying the after-treatment with the silane gas. As apparent from FIG. 8, the after-treatment with the silane gas is effective for shortening the time required for forming precoating films of a predetermined thickness in each of the reactant gas supply rate-limiting reaction and the reaction rate-limiting reaction, leading to shortening of the entire processing time. It should be noted that the purging with a silane gas in the pretreatment makes it possible to shorten the incubation time during which a film is not formed, leading to the shortened pre-coating time.

As described previously, the shower head section 72 included in the apparatus of the present invention is of a two-layer structure. The particular construction is effective for continuous formation of films, as shown in Table 1. In this experiment, the diameters and numbers of the dispersion holes in each of the upper dispersion plate 82 and the uniform dispersion plate 82 were changed in various fashions in an attempt to look into the differences in formation of tungsten silicide film.

TABLE 1

| | Comparative Example 1 | Comparative Example 2 | Comparative Example 3 | Example 1 | Example 2 |
|---|---|---|---|---|---|
| Upper dispersion plate | 13 mm φ × 8 holes | 3 mm φ × 8 holes | 1.5 mm φ × 1 hole | 1.5 mm φ × 1 hole | 1.5 mm φ × 1 hole |
| Uniform dispersion plate | 4 mm φ × 188" (0.3 hole/cm$^2$) | 4 mm φ × 188" (0.3 hole/cm$^2$) | 4 mm φ × 188" (0.3 hole/cm$^2$) | 0.65 mm φ × 188 (0.3 hole/cm$^2$) | 0.5 mm φ × 722" |
| Formation of tungsten silicide film | Formed on edge portion alone | Considerably thin in central portion | 8% | 2% | 2% |

The gas ejection wall 78 used in this experiment, which had a diameter of about 316 mm, was similar to a conventional gas ejection wall in the diameter of the gas ejection hole 80 and the distribution density of the holes 80. For example, the diameter of the hole 80 was 1 mm, and 4397 holes were arranged within a circular area having a diameter of 230 mm, i.e., about 10 holes/cm$^2$. Also, the diameter of the dispersion plate was set at about 260 mm. It should be noted that, in order to supply the gases uniformly over the entire region of the process chamber 20, the construction of the uniform dispersion plate 86 arranged below the upper dispersion plate 82 is very important. Therefore, the construction of the uniform dispersion plate 86 was changed in various fashions in this experiment.

As shown in Table 1, the diameters of the holes formed in the upper dispersion plates for Comparative Examples 1 and 2 were considerably large, i.e., 13 mm and 3 mm, respectively. In addition, a large number of holes, i.e., 8 holes, were formed in the upper dispersion plate in each of Comparative Examples 1 and 2. In each of these cases, a tungsten silicide layer, which is formed by a reactant supply rate-limiting reaction, is formed on an edge portion alone of the wafer.

Comparative Example 3 was set equal to Comparative Examples 1 and 2 in the diameter and the number of holes formed through the uniform dispersion plate 86. In Comparative Example 3, however, the diameter of the hole formed through the upper dispersion plate 82 was small, i.e., about 1.5 mm. In addition, only one hole was formed through the upper dispersion plate 82. A tungsten silicide layer was certainly formed over the entire region of the wafer including the central portion in Comparative Example 3. However, the tungsten silicide layer in the central portion was found to be considerably thinner than that in the edge portion.

On the other hand, the upper dispersion plate 82 equal to that used in Comparative Example 3 was used in each of Examples 1 and 2 of the present invention. In Example 1, however, the diameter of the hole formed through the uniform dispersion plate 86 was set at 0.65 mm. Also, 188 holes were formed through the uniform dispersion plate 86 (about 0.3 hole/cm$^2$). Further, in Example 2, the diameter of the hole 88 formed through the uniform dispersion plate 86 was set at 0.5 mm. Also, 722 holes were formed through the uniform dispersion plate 86 (about 1.4 hole/cm$^2$). As shown in Table 1, the uniformity in thickness of the tungsten silicide layer over the entire region of the wafer was found to be only about 2% in each of Examples 1 and 2, supporting that it is very important to determine appropriately the diameter and the number of dispersion holes 88 formed through the uniform dispersion plate as defined in the present invention.

In the embodiment described above, a semiconductor wafer is used as an object to be processed. However, it is also possible to employ the technical idea of the present invention for the processing of other objects such as a glass substrate and an LCD substrate.

Also, in the embodiment described above, the first gas composition supplied into the process chamber in the pretreatment for forming a first pre-coating film, i.e., polysilicon film doped with phosphorus, was equal to the first gas composition supplied into the process chamber for forming a first layer, i.e., the polysilicon layer 10 doped with phosphorus, on the wafer. However, it is not absolutely necessary to use the gases of the same composition for forming the pre-coating film and polysilicon layer 10 on the wafer. For example, it is possible to omit the use of a $PH_3$ gas for forming the first pre-coating film as already described herein before. In this case, the pre-coating film (polysilicon film) formed in the pretreatment is not doped with phosphorus, though the polysilicon layer 10 formed in the subsequent step on the wafer W is doped with phosphorus. It follows that, strictly speaking, the first pre-coating film formed in the pretreatment and the polysilicon layer 10 formed on the wafer W are not exactly equal to each other. However, it is practically reasonable to understand that these pre-coating film and the polysilicon layer consist mainly of the same composition.

On the other hand, it is possible for the second gas composition used in the pretreatment for forming the second pre-coating film, i.e., tungsten silicide film, to be different from the second gas composition used for forming the tungsten silicide layer 12. For example, it is possible to use an $SiH_2Cl_2$ gas for forming the second pre-coating film and an $SiH_4$ gas for forming the tungsten silicide layer 12 on the wafer. Of course, such a small difference in respect of the presence or absence and the kind of the impurity is acceptable, as far as the second pre-coating film and the tungsten silicide layer 12 formed on the wafer are substantially equal to each other in composition.

In the embodiment described above, the gate electrode is of two layer structure consisting of a polysilicon layer and a tungsten silicide layer formed on the polysilicon layer. However, the construction of the gate electrode is not limited to that noted above. Of course, the gate electrode may be formed of three or more layers in place of the gate electrode of the two layer structure.

As described above, the film-forming method and apparatus of the present invention produce prominent effects. To reiterate, the method of the present invention is featured in that, in preparation for consecutive formation of a plurality of films on a wafer within the process chamber, gas compositions are supplied in advance into the process chamber for forming a plurality of pre-coating films on the inner surface of the process chamber and on the surface of the internal structure of the process vessel so as to stabilize the thermal reflectance, thermal emissivity, etc. on the inner surface of the process chamber and on the surface of the internal structure of the process vessel. As a result, the laminate structure consisting of a polysilicon layer and a tungsten silicide layer can be consecutively formed on a wafer with a high reproducibility.

Also, after the consecutive film-forming operations to form the laminate structure noted above on a wafer, an after-treatment is performed in which a silane-series gas is allowed to flow through the process vessel. As a result, the stress remaining in the upper layer of the laminate structure can be moderated so as to improve the bonding strength between the upper and lower layers of the laminate structure. In addition, the particular after-treatment is effective for inhibiting an oxygen diffusion into the upper layer of the laminate structure in the subsequent heat treating step.

It should also be noted that after the consecutive film-forming operations to form the laminate structure noted above on a wafer, the process chamber is purged with a halogen gas, e.g., a fluorine-containing gas, followed by allowing a silane-series gas to flow through the process vessel. As a result, the halogen gas remaining within the process vessel can be effectively released out of the process chamber. Also, the treatment with the silane-series gas noted above is effective for promoting the pre-coating film formation during the pretreatment for the subsequent operations for forming the films on a new wafer.

Further, in the film-forming apparatus of the present invention, a uniform dispersion plate is arranged within a shower head section of the apparatus. What should be noted is that a large number of dispersion holes having a small diameter are formed through the uniform dispersion plate at a high distribution density, making it possible to supply the gases uniformly over the entire region of the process chamber for forming a film in each of the reactant gas supply rate-limiting reaction and the reaction rate-limiting reaction. It follows that a plurality of different kinds of films can be successively formed within the same process chamber such that the formed films are uniform in thickness over the entire region of the wafer or the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for forming laminated layers, comprising:

a process vessel including a process chamber for housing an object to be processed;

a shower head section having a gas chamber defined therein, said shower head section being exposed to face the object housed in said process chamber, having a gas ejection wall provided with a plurality of gas ejection holes communicating with both said gas chamber and the process chamber, and a gas inlet port for supplying film-forming gases used for a reaction rate-limiting reaction and other film-forming gases used for a reactant gas supply rate-limiting reaction separately into the gas chamber;

a uniform dispersion plate arranged within the gas chamber so as to be interposed between said gas ejection wall and said gas inlet port, positioned a predetermined distance apart from each of the gas ejection wall and gas inlet port, and provided with a plurality of dispersion holes formed therethrough, the diameter of said dispersion holes and distribution density of these dispersion holes being determined so as to permit each of the film-forming gases used for a reaction rate-limiting reaction and other film-forming gases used for a reactant gas supply rate-limiting reaction to flow uniformly over the entire region of the process chamber, wherein the diameter of said dispersion hole is at most 0.7 mm, and the distribution density of said dispersion holes is at least 0.3 hole/cm$^2$;

a reaction rate-limiting reaction gas supply mechanism connected to said process vessel configured to supply a reaction rate-limiting reaction gas; and a gas supply rate-limiting reaction gas supply mechanism connected to said process vessel configured to supply a supply rate-limiting reaction gas to said gas chamber.

2. The apparatus for forming laminated layers according to claim 1, wherein the diameter of said dispersion hole is at about 0.1 to 0.7 mm, and the distribution density of said dispersion holes falls within a range of between 0.3 hole/cm$^2$ and 1.0 hole/cm$^2$.

3. The apparatus for forming laminated layers according to claim 2, further comprising an upper dispersion plate arranged within the gas chamber, interposed between said uniform dispersion plate and the gas inlet port, positioned a predetermined distance apart from each of these uniform dispersion plate and gas inlet port, and provided with at least one gas passing hole.

4. The apparatus according to claim 1, herein all dispersion holes of the lower dispersion plate have the same diameter.

5. The apparatus according to claim 1, wherein:

said reaction rate-limiting gas supply mechanism comprises a reaction rate-limiting reaction gas source and a first gas flow controller; and said gas supply rate-limiting mechanism comprises a supply rate-limiting reaction gas source and a second gas flow controller.

* * * * *

UNITED STATES PATENT AND TRADEMARK OFFICE
CERTIFICATE OF CORRECTION

PATENT NO. : 6,251,188 B1
DATED : June 26, 2001
INVENTOR(S) : Tsuyoshi Hashimoto et al.

Page 1 of 1

It is certified that error appears in the above-identified patent and that said Letters Patent is hereby corrected as shown below:

<u>Column 18,</u>
Lines 27-30, delete "..., wherein the diameter of said dispersion hole is at most 0.7 mm, and the distribution density of said dispersion holes is at lease 0.3 hole/cm$^2$.";
Line 49, change "herein" to -- wherein --.

Signed and Sealed this

Fourteenth Day of May, 2002

Attest:

JAMES E. ROGAN
Attesting Officer    Director of the United States Patent and Trademark Office